United States Patent [19]

Mori

[11] Patent Number: 5,694,357
[45] Date of Patent: Dec. 2, 1997

[54] NONVOLATILE SEMICONDUCTOR MEMORY DEVICE FOR STORING MULTI-VALUE DATA

[75] Inventor: Seiichi Mori, Tokyo, Japan

[73] Assignee: Kabushiki Kaisha Toshiba, Kawasaki, Japan

[21] Appl. No.: 649,767

[22] Filed: May 15, 1996

[30] Foreign Application Priority Data

May 17, 1995 [JP] Japan ................................. 7-118093

[51] Int. Cl.[6] ................................................ G11C 27/00
[52] U.S. Cl. .................................. 365/185.03; 365/185.08; 365/185.24
[58] Field of Search ................... 365/185.03, 185.08, 365/185.24; 327/314, 315, 316, 317, 318

[56] References Cited

U.S. PATENT DOCUMENTS

| | | | |
|---|---|---|---|
| 4,627,027 | 12/1986 | Rai et al. | 365/185.03 |
| 5,043,940 | 8/1991 | Harari | 365/185.03 |

OTHER PUBLICATIONS

Extended Abstracts of the 18th (1986 International) Conference on Solid State Devices and Materials, Tokyo, 1986, pp. 327–330.
International Electron Devices Meeting, 1990, San Francisco, CA, Dec. 9–12, 1990.

*Primary Examiner*—David C. Nelms
*Assistant Examiner*—Vu A. Le
*Attorney, Agent, or Firm*—Banner & Witcoff, Ltd.

[57] ABSTRACT

Each of the cell transistors which constitute an EEPROM is set one of the first to fourth threshold voltages, to store one of four different data items. The first and fourth threshold voltages are the lowest and the highest of the four, respectively, and the second threshold voltage is lower than the third threshold voltage. Each cell transistor is set at a neutral threshold voltage when the charge-accumulating layer accumulates no charge. The neutral threshold voltage is higher than the second threshold voltage and lower than the third threshold voltage. The difference between the neutral threshold voltage and one of the four threshold voltages is so small that the self-field of the cell transistor has a low intensity.

33 Claims, 3 Drawing Sheets

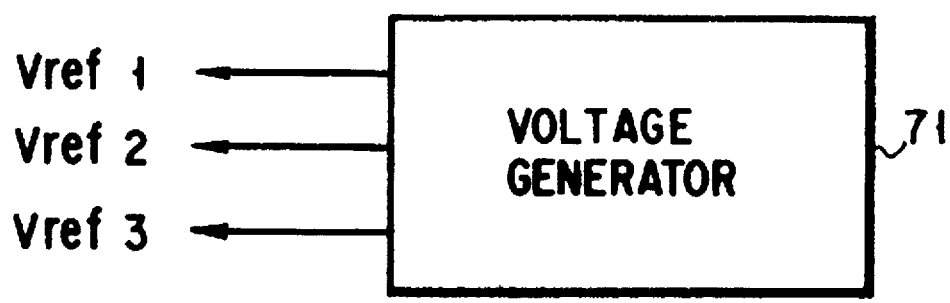
F I G. 7

NONVOLATILE SEMICONDUCTOR MEMORY DEVICE FOR STORING MULTI-VALUE DATA

BACKGROUND OF THE INVENTION

1. Field of the Invention

The present invention relates to a semiconductor memory device, and more particularly to a method of designing cell transistors for use in a nonvolatile semiconductor memory device such a flash EEPROM.

2. Description of the Related Art

In each memory cell of a flash EEPROM, "0" is stored by injecting electrons into the floating gate of the cell transistor, raising the threshold voltage of the transistor. In the memory cell, "1" is stored by accumulating virtually no electric charge in the floating gate, thus maintaining the gate in neutral state, or thermal equilibrium. The threshold voltage of the cell transistor is set at, for example, 5V or more to store "0" in the memory cell, and is set in the range of 0V to 3V to store "1" in the memory cell, as is illustrated in FIG. 6. One bit of data, either "0" or "1," is thereby stored in one memory cell.

It is proposed that the number of electrons injected into the floating gate of a cell transistor be determined to increase the amount of data that can be stored. Three reference voltages, for example, are applied to the cell transistor, thereby to determine the following four states the floating gate may assume. The four states are: (1) many electrons exist in the floating gate; (2) less electrons exist in the floating gate; (3) far less electrons exist in the floating gate; and (4) virtually no electrons exist in the floating gate. By distinguishing the four states the floating gate of the cell transistor take, two bits of data can be stored in the memory cell. The threshold voltage must be controlled within a narrower range to store two bits in one memory cell than to store one bit therein.

Memory cells need to keep storing data reliably for a long period of time. If a memory cell is to store two or more bits of data (i.e., multi-value data), its transistor must preserve the threshold voltage within a narrow range for a long time. Here arises a problem.

The electric field which is applied to the insulating film surrounding the floating gate of the transistor much depends on the electric charge in the floating gate. More precisely, the greater the charge, the more intense the electric field applied to insulating film. In other words, the intensity of the electric field (hereinafter referred to as "self-field") increases with the difference between the threshold voltage inherent in the memory cell and the threshold voltage maintaining the floating gate in neutral state. Consequently, an electric charge readily leaks from a memory cell having an intense self-field.

In a memory cell wherein the number of electrons injected into the floating gate of the transistor is controlled, as described above, to store multi-value data (i.e., two or more bits), the self-field of the cell increases with the number of electrons injected into the floating gate. It would then be difficult for the memory cell to hold the data for a long period of time. The data stored will change even if a relatively small number of electrons leaks from the floating gate, lowering the threshold voltage of the transistor to the next lower level. If the memory cell is left to stand, even for a short time, the multi-value data stored in the cell is likely to change.

Generally, it is demanded that a flash EEPROM hold data unchanged for at least ten years once the data has been rewritten into it. In view of this, a multi-value data storing memory cell wherein electrons leak from the floating gate can hardly find practical use in flash EEPROMs.

SUMMARY OF THE INVENTION

The object of the present invention is to provide a nonvolatile semiconductor memory wherein the self-fields of the memory cells as much equal as possible to one another so that each memory cell can hold multi-bit data for a long period of time, regardless of an amount of the electrons injected into the floating gate of the memory cell.

The object is achieved by a nonvolatile semiconductor memory which comprises: a semiconductor substrate; and a MOS transistor having a charge-accumulating layer provided on the semiconductor substrate and set at one of a plurality of threshold voltages in accordance with a charge applied to the charge-accumulating layer, thereby to store multi-value data. The threshold voltages are divided into two groups each consisting of the same number of threshold voltages. The threshold voltages of the first group are lower than a neutral threshold voltage of the MOS transistor, whereas those of the second group are higher than the neutral threshold voltage.

Since the threshold voltages of the first group are lower than the neutral threshold voltage Vth of the MOS transistor, while those of the second group are higher than the neutral threshold voltage Vth, the difference between the neutral threshold voltage Vth and any threshold voltage corresponding to multi-value data can be small. Hence, in the memory cell having the MOS transistor, the self-field applied on the insulating film, which increases to a maximum when a charge is held in the charge-accumulating layer, is less intense than that of a conventional memory cell. The memory cell can therefore hold data for a longer time than the conventional memory cell.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 is a black diagram showing a voltage generator.

DETAILED DESCRIPTION OF THE PREFERRED EMBODIMENTS

An embodiment of the present invention will be described, with reference to the accompanying drawings.

Figure 1:
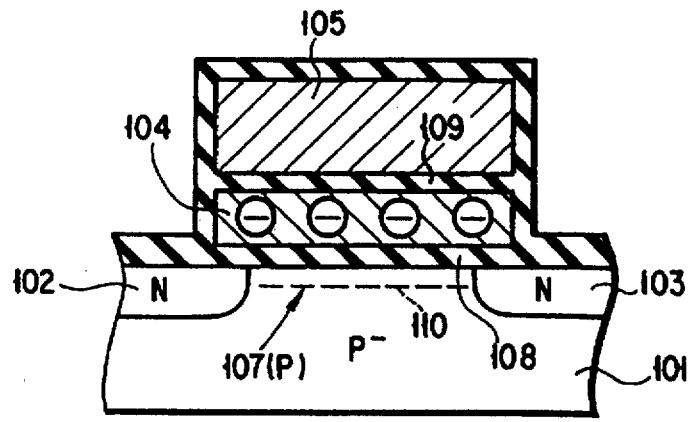
FIG. 1 is a sectional view of a nonvolatile semiconductor memory according to the present invention.

FIG. 1 shows a nonvolatile semiconductor memory according to the present invention. As shown in FIG. 1, the memory has a P-type semiconductor substrate 101. A source region 102 and a drain region 103, each made of an N-type diffusion layer, are provided in the surface of the substrate 101 and spaced away from each other. A channel region 107 is provided in the surface of the substrate 101, located between the source region 102 and the drain region 103. An insulating (tunnel oxide) film 108 is formed on the channel region 107. A floating gate 104 is formed on the insulating film 108. Provided on the floating gate 104 is an insulating film 109. A control gate 105 is formed on the insulating film 109. An impurity 110 has been injected into the channel region 107. The source region 102, drain region 103, floating gate 104, control gate 105, channel region 107 and insulating films 108 and 109 constitute a cell transistor. An impurity has been ion-implanted into the channel region 107, adjusting neutral the threshold voltage of the cell transistor.

Figure 2:
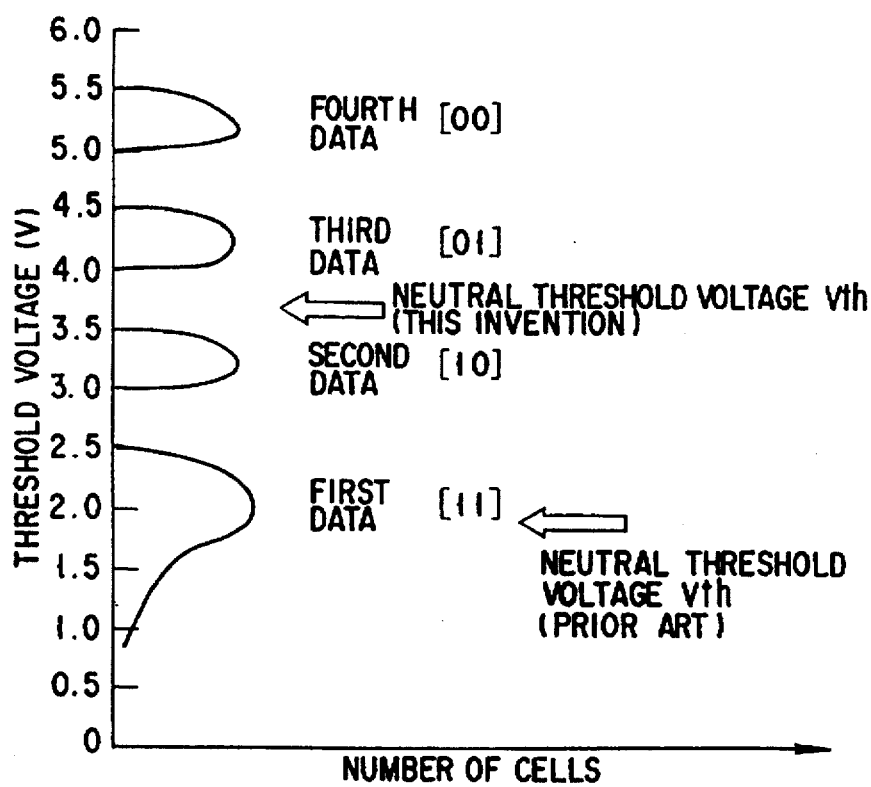
FIG. 2 is a diagram illustrating the relationship between the data stored in the memory cell of the memory and the various threshold voltages of the memory cell.

FIG. 2 is a diagram illustrating the relationship between the four threshold voltages which the cell transistor (FIG. 1) may have and the four different data (each a 2-bit data) which the memory may store, one at a time. The four threshold voltages (Vth) correspond to the four data, as shown below:

| | |
|---|---|
| 0 V to 1.5 V (exclusive) | First data [11] |
| 3.0 V to 3.5 V | Second data [10] |
| 4.0 V to 4.5 V | Third data [01] |
| Higher than 5.0 V | Fourth data [00] |

In a NOR-type flash memory of ordinary type, the cell transistor has a threshold voltage Vth which always assumes a positive value. Should the threshold voltage Vth fall below 0V, a leak current would flow through a column line connecting a plurality of cell transistors, making it no longer possible to read data from these memory cells. Needless to say, each cell transistor cannot store data which may have two or more values corresponding to voltages higher than the voltage (usually about 5V) which is applied on the word line (i.e., control gate) to read data from the transistor. The potential of the word line may be changed to read multi-value data from the transistor. Even in this method of reading data, the highest voltage that is applied on the word line is about 5V.

The neutral threshold voltage Vth of a conventional cell transistor is about 2V, as is shown in FIG. 2. It defines the first data item. In the nonvolatile semiconductor memory according to the present invention, the neutral threshold voltage Vth of the cell transistor ranges from 3.5V to 4.0V, as is shown in FIG. 2. It is set between the threshold voltages which correspond to the second and third data. Since the neutral threshold voltage Vth is halfway between the lowest and highest of the four threshold voltages the cell transistor may have, the difference between the neutral threshold voltage Vth and any other threshold voltage is less than in the conventional cell transistor. Hence, the self-field applied on the transistor while the floating gate 104 is holding a charge is less intense than the self-field applied on the conventional cell transistor in the same condition. This prevents the charge from leaking from the floating gate 104. The gate 104 can hold the charge more readily than its counterpart of the conventional cell transistor.

The neutral threshold voltage Vth can be set at a desired value by adjusting the amount in which impurity is ion-implanted into the channel region 107. For example, the neutral threshold voltage Vth can be made higher than that of a conventional cell transistor, by increasing the amount of impurity.

When the impurity is ion-implanted by ordinary method, the impurity ions are distributed in the entire channel region 107. As a result, the withstand voltage at the junction between the substrate 101 and the source region 102, and the withstand voltage at the junction between the substrate 101 and the drain region 103 are lower than in the conventional cell transistor. If electrons are emitted from the floating gate 104 into the source region 102 as in a flash memory, it is difficult to extract the electrons from the gate 104 at a sufficiently high speed. If hot electrons are injected from the drain region 103 into the gate 104, a high voltage cannot be applied to the drain region 103, making it impossible to write data at as high a speed as is practically demanded. Therefore it is necessary to locate the impurity layer used to dope the channel region 107, at some distance from the source region 102 or the drain region 103, or from both.

The impurity layer may be located so, by various methods. For example, the impurity may be introduced into the substrate 101 slantwise from one of the diffusion layers, i.e., the source region 102 or the drain region 103, in order to impart a desired with-stand voltage to the other of the diffusion layers. This method is disclosed in, for example, the thesis of Y. Ohsima et al., IEDM Technical Digest, pp. 95–98, 1990.

Figure 3:
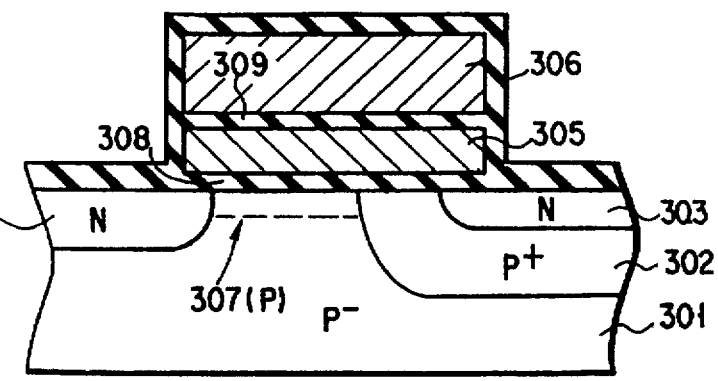
FIG. 3 is a sectional view of a memory cell which has the high neutral threshold voltage shown in FIG. 2.

FIG. 3 is a sectional view of a cell transistor whose source region has a withstand voltage increased by the method described in the preceding paragraph. As shown in FIG. 3, this cell transistor comprises a drain 303 and a source region 304 provided in one major surface of a P-type semiconductor substrate 301 and spaced apart from each other. Both regions 303 and 304 are made of an N-type diffusion layer each.

The cell transistor further comprises a P-type diffusion layer 302, a floating gate 305, a control gate 306, a P-type channel region 307, and two insulating film 308 and 309. The diffusion layer 302 has a high impurity concentration and surrounds the drain region 303. It has been formed by diffusing an impurity into the substrate 301 slantwise from the drain region 303. The impurity may be, for example, boron. The channel region 307 has been formed by injecting an impurity into that surface region of the substrate 301 which lies between the drain region 303 and the source region 304. The region 307 has an impurity concentration determined by the neutral threshold voltage of the cell transistor, the withstand voltage of the drain region 303 and the withstand voltage of the source region 304. The insulating film 308 is provided on the channel region 307, on which the floating gate 305 is formed. The insulating film 309 is provided on the floating gate 305, on which the control electrode 306 is formed.

The semiconductor substrate 301, channel region 307 and the diffusion layer 302 have the following relationship in terms of impurity concentration:

$P^-<P<P^+$ where $P^-$ is the concentration impurity of the substrate 301, P is that of the region 307, and $P^+$ is that of the layer 302.

To impart a sufficient withstand voltage to both the drain region and the source region of a cell transistor, an impurity may be introduced into only the center part of the channel region. The impurity may be introduced by means of focused ion-beam implantation, which is disclosed in, for example, the thesis of S. Shukuri et al., Extended Abstracts of the 18th ICSSDM, pp. 327–330, 1986.

Figure 4:
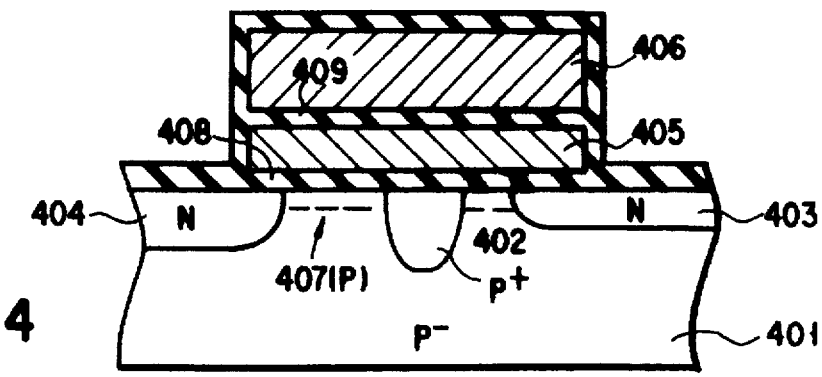
FIG. 4 is a sectional view of another memory cell which has the high neutral threshold voltage shown in FIG. 2.

FIG. 4 is a sectional view of a cell transistor whose source and drain regions have a withstand voltage increased by focused ion-beam implantation. As shown in FIG. 4, this cell transistor comprises a drain 403 and a source region 404 provided in one major surface of a P-type semiconductor substrate 401 and spaced apart from each other. Both regions 403 and 404 are made of an N-type diffusion layer each. The cell transistor further comprises a P-type diffusion layer 402, a floating gate 405, a control gate 406, a P-type channel region 407, and two insulating film 408 and 409. The diffusion layer 402 is provided in that part of the substrate 401 which lies between the drain region 403 and the source region 404. It extends in the widthwise direction of the substrate 401 and has a higher impurity concentration than the substrate 401. The insulating film (tunnel oxide film) 408 is provided on the channel region 407, on which the floating gate 405 is formed. The insulating film 409 is provided on the floating gate 405, on which the control electrode 406 is formed.

The semiconductor substrate 401, channel region 407 and the diffusion layer 402 have the following relationship in terms of impurity concentration:

$$P^- < P < P^+$$

where $P^-$ is the concentration impurity of the substrate 401, P is that of the region 407, and $P^+$ is that of the layer 402.

According to the embodiment, the neutral threshold voltage of the cell transistor is exactly the average of four voltages which correspond, respectively, to the four data which the cell transistor may store. The greatest charge the cell transistor holds to store one of the four data is therefore less than otherwise. Hence, the self-field in either insulating film, which is maximal when the transistor holds the charge, is less intense than in the conventional cell transistor. Even if the cell transistor is left to stand for a long time, it keeps holding the charge reliably.

In the embodiment shown in FIG. 4, however, the electric field applied to the components to read data from the cell transistor may not become minimal. When a voltage of 5V is applied to the floating gate 405 to read the first data (FIG. 2), the electric field applied to the insulating film (tunnel oxide film) 408 is more intense than in the conventional cell transistor. This is because the neutral threshold voltage Vth of the cell transistor ranges from 3.5V to 4.0V, whereas the neutral threshold voltage Vth of the conventional cell transistor is about 2V. Thus, the cell transistor shown in FIG. 4 is more likely to make errors than the conventional cell transistor, when the data is repeatedly read from it.

Figure 5:
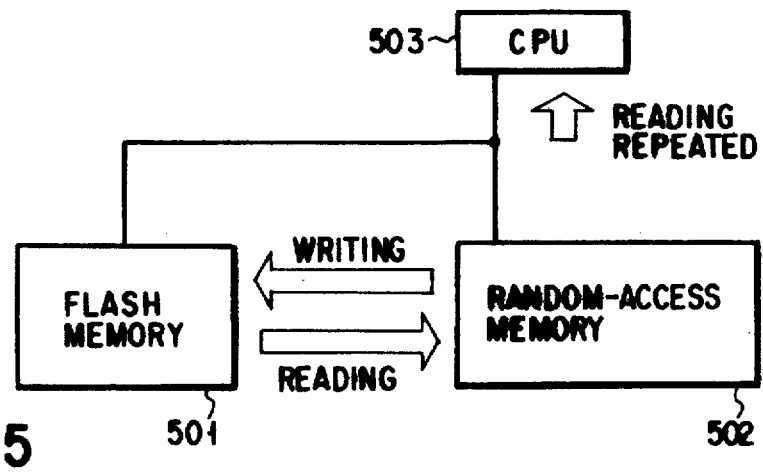
FIG. 5 a block diagram showing a device in which the nonvolatile semiconductor memory of this invention is used effectively.
Figure 6:
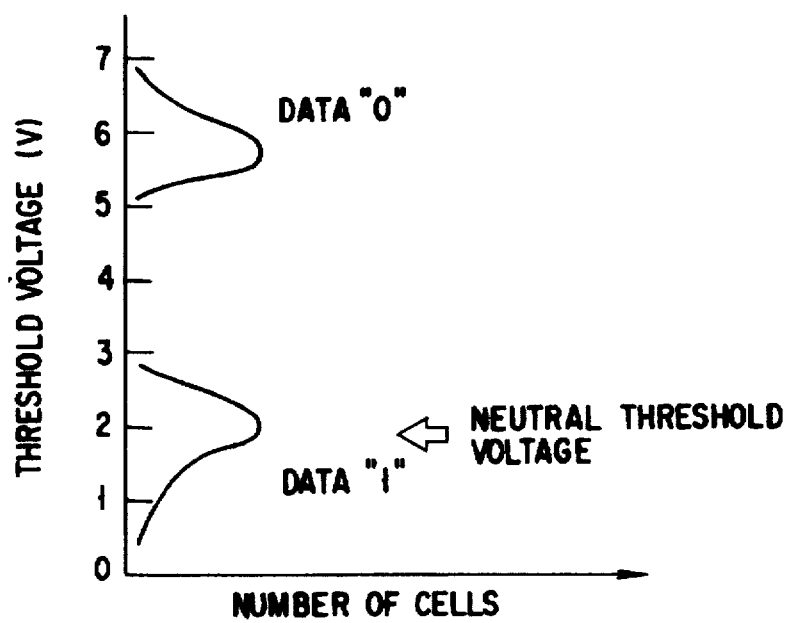
FIG. 6 is a diagram illustrating the operation of a conventional nonvolatile semiconductor memory.

Despite this, the cell transistor of FIG. 4 can operate effectively it incorporated in a device shown in FIG. 5. In the device, the cell transistor is used as a cell of a flash memory 501. The memory 501 is, for example, a NOR-type flash EEPROM comprising a plurality of EEPROMs. Each memory cell (not shown) of the flash memory 501 has a neutral threshold voltage which is comparatively high and can store 2-bit data. Connected to the flash memory 501 is a random-access memory 502 which is either a DRAM or a SRAM. The random-access memory 502 has a storage capacity less than that of the flash memory 501.

Both the flash memory 501 and the random-access memory 502 are connected to a CPU 503. The CPU 503 controls both memories 501 and 502. The data read from the flash memory 501 under the control of the CPU 503 is stored into the random-access memory 502. The data stored in the random-access memory 502 is repeatedly read under the control of the CPU 503. Furthermore, it is written into the flash memory 501 under the control of the CPU 503.

Since the data read from the flash memory 501 is stored into the random-access memory 502 and read therefrom, each cell of the flash memory 501 is accessed less times than in the case the data is directly from the flash memory 501. This serves to decrease the possibility that the cell transistor shown in FIG. 4 makes errors.

It takes more time to read multi-value data from each cell transistor of the flash memory 501 than to read one-bit data therefrom. Nonetheless, multi-value data can be read faster since the data is first read from the flash memory 501 and then written into the random-access memory 501.

FIG. 7 shows a voltage generator 7. The voltage generator 7 generates reference voltages Vref1, Vref2 and Vref3 which are used to read data from the memory cell and to write data to the memory cell. The reference voltage Vref1 is between the threshold voltage of the first data and the threshold voltage of the second data, the reference voltage Vref2 between the threshold voltage of the second data and the threshold voltage of the third data, the reference voltage Vref3 between the threshold voltage of the third data and the threshold voltage of the fourth data. The voltages Vref1 to Vref3 are supplied to the control gate of the memory cells N+M−1 times (wherein N+M is larger than 2) while the memory cells are selected. A voltage (not shown) lower than the threshold voltage of the first data is supplied to the control gate of the memory cells while the memory cells remain not selected.

In the embodiments described above, the number of the threshold voltage ranges set in the memory cell is not limited to four. In the memory cell, $2^{n+1}$ (n is positive integer) threshold voltages can be set.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nonvolatile semiconductor memory comprising:
   a semiconductor substrate of a first conductivity type; and
   a MOS transistor having a charge-accumulating layer provided on said semiconductor substrate and set at one of first to fourth threshold voltages in accordance with a charge applied to said charge-accumulating layer, thereby to store multi-value data,
   wherein said MOS transistor is set at a neutral threshold voltage when said charge-accumulating layer accumulates no charge, and the neutral threshold voltage is higher than the second threshold voltage which is higher than the first threshold voltage and the neutral threshold voltage is lower than the third threshold voltage which is lower than the fourth threshold voltage,
   wherein a difference between the neutral threshold voltage and the first threshold voltage is equal to a difference between the neutral threshold voltage and the fourth threshold voltage.

2. A device according to claim 1, wherein said MOS transistor comprises first and second semiconductor layers of a second conductivity type provided in said semiconductor substrate and functioning as a source and a drain, respectively, and a channel region provided in said semiconductor substrate and located between said first and second semiconductor layers, and the neutral threshold voltage is set by a third semiconductor layer of the first conductivity type which is a part of said channel region.

3. A device according to claim 1, wherein said MOS transistor comprises:

first and second semiconductor layers of a second conductivity type provided in said semiconductor substrate and functioning as a source and a drain, respectively;

a third semiconductor layer of the first conductivity type provided in said semiconductor substrate and contacting said second semiconductor layer;

a channel region provided in said semiconductor substrate and located between said first and third semiconductor layers, wherein said charge-accumulating layer comprises a floating gate located above said channel region and insulated therefrom; and a control gate located above said floating gate and insulated therefrom.

4. A device according to claim 2, wherein said channel region has an impurity concentration higher than an impurity concentration of said semiconductor substrate, and said third semiconductor layer has an impurity concentration higher than an impurity concentration of said channel region.

5. A device according to claim 1, wherein said MOS transistor comprises:

first and second semiconductor layers of a second conductivity type provided in said semiconductor substrate and functioning as a source and a drain, respectively;

a channel region provided in said semiconductor substrate and located between said first and second semiconductor layers, wherein said charge-accumulating layer comprises a floating gate located above said channel region and insulated therefrom;

a third semiconductor layer of the first conductivity type provided in a center part of said channel region; and a control gate located above said floating gate and insulated therefrom.

6. A device according to claim 5, wherein said channel region has an impurity concentration higher than an impurity concentration of said semiconductor substrate, and said third semiconductor layer has an impurity concentration higher than an impurity concentration of said channel region.

7. A nonvolatile semiconductor memory comprising:

a semiconductor substrate of a first conductivity type; and a MOS transistor having a charge-accumulating layer provided on said semiconductor substrate and set at one of a plurality of threshold voltages in accordance with a charge applied to said charge accumulating layer, thereby to store multi-value data, wherein the threshold voltages are divided into two groups each consisting of the same number of threshold voltages, the threshold voltages of the first group being lower than a neutral threshold voltage of said MOS transistor, and the threshold voltages of the second group being higher than the neutral threshold voltage, wherein a difference between the neutral threshold voltage and one of the threshold voltages of the first group is equal to a difference between the neutral threshold voltage and one of the threshold voltages of the second group.

8. A device according to claim 7, wherein said MOS transistor comprises first and second semiconductor layers of a second conductivity type provided in said semiconductor substrate and functioning as a source and a drain, respectively, and a channel region provided in said semiconductor substrate and located between said first and second semiconductor layers, and the neutral threshold voltage is set by a third semiconductor layer of the first conductivity type which is a part of said channel region.

9. A device according to claim 7, wherein said MOS transistor comprises:

first and second semiconductor layers of a second conductivity type provided in said semiconductor substrate and functioning as a source and a drain, respectively;

a third semiconductor layer of the first conductivity type provided in said semiconductor substrate and contacting said second semiconductor layer;

a channel region provided in said semiconductor substrate and located between said first and third semiconductor layers, wherein said charge-accumulating layer comprises a floating gate located above said channel region and insulated therefrom; and a control gate located above said floating gate and insulated therefrom.

10. A device according to claim 9, wherein said channel region has an impurity concentration higher than an impurity concentration of said semiconductor substrate, and said third semiconductor layer has an impurity concentration higher than an impurity concentration of said channel region.

11. A device according to claim 7, wherein said MOS transistor comprises:

first and second semiconductor layers of a second conductivity type provided in said semiconductor substrate and functioning as a source and a drain, respectively;

a channel region provided in said semiconductor substrate and located between said first and second semiconductor layers, wherein said charge-accumulating layer comprises a floating gate located above said channel region and insulated therefrom;

a third semiconductor layer of the first conductivity type provided in a center part of said channel region; and a control gate located above said floating gate and insulated therefrom.

12. A device according to claim 11, wherein said channel region has an impurity concentration higher than an impurity concentration of said semiconductor substrate, and said third semiconductor layer has an impurity concentration higher than an impurity concentration of said channel region.

13. A nonvolatile semiconductor memory comprising:

a first memory-cell array comprising a plurality of memory cells for storing multi-value data;

a second memory-cell array comprising random-access memory cells for storing the multi-value data read from said first memory-cell array; and a control circuit connected to said first and second memory-cell arrays, for reading data stored in said second memory-cell array.

14. A device according to claim 13, wherein each memory cell of said first memory-cell array comprises a MOS transistor which has a charge-accumulating layer, which is set at one of a plurality of threshold voltages in accordance with a charge applied to the charge-accumulating layer, thereby to store multi-value data, and which is set at a neutral threshold voltage when said charge-accumulating layer accumulates no charge, the threshold voltages are divided into two groups each consisting of the same number of threshold voltages, and a threshold voltages of said first group are lower than the neutral threshold voltage of said MOS transistor and the threshold voltages of the second group are higher than the neutral threshold voltage.

15. A device according to claim 14, wherein each of said MOS transistors comprises first and second semiconductor layers of a second conductivity type provided in a semiconductor substrate of a first conductivity type and functioning as a source and a drain, respectively, and a channel region provided in said semiconductor substrate and located between said first and second semiconductor layers, and the neutral threshold voltage is set by a third semiconductor layer of the first conductivity type which is a part of said channel region.

16. A device according to claim 14, wherein each of said MOS transistors comprises:
   first and second semiconductor layers of a second conductivity type provided in a semiconductor substrate of a first conductivity type and functioning as a source and a drain, respectively;
   a third semiconductor layer of the first conductivity type provided in said semiconductor substrate and contacting said second semiconductor layer;
   a channel region provided in said semiconductor substrate and located between said first and third semiconductor layers, wherein said charge-accumulating layer comprises a floating gate located above said channel region and insulated therefrom; and
   a control gate located above said floating gate and insulated therefrom.

17. A device according to claim 16, wherein said channel region has an impurity concentration higher than an impurity concentration of said semiconductor substrate, and said third semiconductor layer has an impurity concentration higher than an impurity concentration of said channel region.

18. A device according to claim 14, wherein each of said MOS transistors comprises:
   first and second semiconductor layers of a second conductivity type provided in said semiconductor substrate and functioning as a source and a drain, respectively;
   a channel region provided in said semiconductor substrate and located between said first and second semiconductor layers, wherein said charge-accumulating layer comprises a floating gate located above said channel region and insulated therefrom;
   a third semiconductor layer of the first conductivity type provided in a center part of said channel region; and
   a control gate located above said floating gate and insulated therefrom.

19. A device according to claim 18, wherein said channel region has an impurity concentration higher than an impurity concentration of said semiconductor substrate, and said third semiconductor layer has an impurity concentration higher than an impurity, concentration of said channel region.

20. A method for assigning first to fourth threshold voltage ranges of multi-bit data stored in a MIS transistor with a floating gate with a neutral threshold voltage comprising steps of:
   assigning the first threshold voltage range above the neutral threshold voltage;
   assigning the second threshold voltage range above the neutral threshold voltage; assigning the third threshold voltage range below the neutral threshold voltage; and assigning the fourth threshold voltage range below the neutral threshold voltage,
   wherein a difference between the neutral threshold voltage and the first threshold voltage range is equal to a difference between the neutral threshold voltage and the fourth threshold voltage range.

21. The method according to claim 20, wherein a first voltage applied to a control gate of said MIS transistor when said MIS transistor is selected is above the second threshold voltage range and below the first threshold voltage range.

22. The method according to claim 20, wherein a second voltage applied to a control gate of said MIS transistor when said MIS transistor is not selected is lower than all of the first to the fourth threshold voltage ranges.

23. The method according to claim 20, wherein the first to the fourth threshold voltage ranges do not overlap each other.

24. The method according to claim 20, wherein said MIS transistor comprises first and second semiconductor layers of a second conductivity type provided in a semiconductor substrate of a first conductivity type and functioning as a source and a drain, respectively, and a channel region provided in said semiconductor substrate and located between said first and second semiconductor layers, and the neutral threshold voltage is set by a third semiconductor layer of the first conductivity type which is a part of said channel region.

25. The method according to claim 20, wherein said MIS transistor comprises:
   first and second semiconductor layers of a second conductivity type provided in a semiconductor substrate Of a first conductivity type and functioning as a source and a drain, respectively;
   a third semiconductor layer of the first conductivity type provided in said semiconductor substrate and contacting said second semiconductor layer;
   a channel region provided in said semiconductor substrate and located between said first and third semiconductor layers, wherein said floating gate is located above said channel region and insulated therefrom; and
   a control gate located above said floating gate and insulated therefrom.

26. A method for assigning a plurality of threshold voltage ranges of multi-bit data stored in a MIS transistor with a floating gate with a neutral threshold voltage comprising steps of:
   assigning a part of the threshold voltage ranges above the neutral threshold voltage; and
   assigning the rest of the threshold voltage ranges below the neutral threshold voltage,
   wherein a difference between the neutral threshold voltage and the highest of the threshold voltage ranges above the neutral threshold voltage is equal to a difference between the neutral threshold voltage and the lowest of the threshold voltage ranges below the neutral threshold voltage.

27. The method according to claim 26, wherein the number of threshold voltage ranges above the neutral threshold voltage is the same as the number of threshold voltage ranges below the neutral threshold voltage.

28. The method according to claim 26, wherein the number of threshold voltage ranges is $2^{N+1}$ (where N is positive integer).

29. A method for storing and reading multi-bit data stored in a MIS transistor with a floating gate with a certain neutral threshold voltage, comprising steps of:
   assigning a first threshold voltage range above the neutral threshold voltage;
   assigning a second threshold voltage range above the neutral threshold voltage and below the first threshold voltage range;

assigning a third threshold voltage range below the neutral threshold voltage;

assigning a fourth threshold voltage range below the third threshold voltage;

applying a first control voltage at a control gate of the MIS transistor, the first control voltage being between the first and the second threshold voltage ranges;

applying a second control voltage at said control gate, the second control voltage being between the second and the third threshold voltage ranges; and applying a third control voltage at said control gate, the third control voltage being between the third and the fourth threshold voltage ranges.

30. A method for storing and reading a multi-bit data stored using a MIS transistor with a floating gate with a certain neutral threshold voltage comprising steps of:

assigning N (integer) threshold voltage ranges of the multi-bit data storage above the neutral threshold voltage;

assigning M (integer) threshold voltage ranges of the multi-bit data storage below the neutral threshold voltage; and applying control voltages at a control gate of the MIS transistor N+M−1 times, each of the applied voltages being between two of the threshold voltage ranges, wherein N+M is larger than 2, and the threshold voltage ranges are not overlapping.

31. A device according to claim 7, wherein the one threshold voltage of the first group is the highest threshold voltage of the first group and the one threshold voltage of the second group is the lowest threshold voltage of the second group.

32. A nonvolatile semiconductor memory cell comprising a charge storing layer, said nonvolatile semiconductor memory cell having a neutral threshold voltage in the absence of a net charge on said charge storing layer and $2^{N+1}$ (N being a positive integer) programmable threshold voltage ranges each resulting from a respective level of charge being placed on said charge storing layer and each representing a respective data state, wherein the neutral threshold voltage is halfway between the highest and the lowest of the programmable threshold voltage ranges.

33. A nonvolatile semiconductor memory cell according to claim 32, wherein said charge storing region comprises a floating gate electrode insulatively spaced from a channel region between source and drain regions of said nonvolatile semiconductor memory cell.

* * * * *